(12) United States Patent
Funo et al.

(10) Patent No.: US 10,396,224 B2
(45) Date of Patent: Aug. 27, 2019

(54) SOLAR CELL INTEGRATED FILM MATERIAL

(71) Applicant: Chukoh Chemical Industries, Ltd., Minato-ku, Tokyo (JP)

(72) Inventors: Hidekazu Funo, Kawasaki (JP); Yoshihisa Fujita, Kawasaki (JP); Taisuke Yumura, Matsuura (JP); Shigenori Tamura, Matsuura (JP)

(73) Assignee: Chukoh Chemical Industries, Ltd., Minato-ku (JP)

( * ) Notice: Subject to any disclaimer, the term of this patent is extended or adjusted under 35 U.S.C. 154(b) by 145 days.

(21) Appl. No.: 14/732,317

(22) Filed: Jun. 5, 2015

(65) Prior Publication Data

US 2015/0270426 A1 Sep. 24, 2015

Related U.S. Application Data

(63) Continuation of application No. PCT/JP2013/082864, filed on Dec. 6, 2013.

(30) Foreign Application Priority Data

Dec. 7, 2012 (JP) ................................ 2012-268724

(51) Int. Cl.
*H01L 31/048* (2014.01)
*H01L 31/049* (2014.01)

(52) U.S. Cl.
CPC ........ *H01L 31/0481* (2013.01); *H01L 31/049* (2014.12); *Y02E 10/50* (2013.01)

(58) Field of Classification Search
CPC ..................... H01L 31/0481; H01L 31/0489
See application file for complete search history.

(56) References Cited

U.S. PATENT DOCUMENTS 4,860,509 A * 8/1989 Laaly ............... H01L 31/03926
136/245
5,474,620 A * 12/1995 Nath .................... H01L 31/048
136/251

(Continued)

FOREIGN PATENT DOCUMENTS

EP 0 755 080 A2 1/1997
JP 9-64391 A 3/1997

(Continued)

OTHER PUBLICATIONS

Extended European Search Report dated Jun. 15, 2016, issued in corresponding Application No. EP 13 861 093.6, filed Dec. 6, 2013; 7 pages.

(Continued)

*Primary Examiner* — Golam Mowla
(74) *Attorney, Agent, or Firm* — Christensen O'Connor Johnson Kindness PLLC

(57) ABSTRACT

According to one embodiment, a solar cell integrated film material includes a film material, a solar cell, a glass fiber sheet and bonding layers. The film material includes a heat-resistant fabric and a fluorocarbon resin layer formed on both sides of the heat-resistant fabric. The glass fiber sheet is provided between the film material and the solar cell. The bonding layers are provided between the film material and the glass fiber sheet, and between the glass fiber sheet and the solar cell.

16 Claims, 1 Drawing Sheet

(56) References Cited

U.S. PATENT DOCUMENTS

| | | | | |
|---|---|---|---|---|
| 5,660,645 | A | * | 8/1997 | Mori ................. B32B 17/10678 |
| | | | | 136/251 |
| 6,093,581 | A | * | 7/2000 | Takabayashi ......... H01L 31/048 |
| | | | | 136/251 |
| 6,323,416 | B1 | * | 11/2001 | Komori ................. B32B 17/04 |
| | | | | 136/251 |
| 2007/0128376 | A1 | | 6/2007 | Harada |
| 2010/0006141 | A1 | | 1/2010 | Oikawa |
| 2010/0206377 | A1 | * | 8/2010 | Sahlin ..................... E04D 5/10 |
| | | | | 136/256 |
| 2011/0011457 | A1 | * | 1/2011 | Sportel ................ H01L 31/048 |
| | | | | 136/259 |
| 2011/0030791 | A1 | * | 2/2011 | Snowwhite ......... H01L 31/0481 |
| | | | | 136/259 |
| 2011/0297228 | A1 | | 12/2011 | Li et al. |
| 2012/0328869 | A1 | | 12/2012 | Akasaki |
| 2013/0267637 | A1 | * | 10/2013 | Varkey .................. C08G 18/12 |
| | | | | 524/270 |
| 2014/0041716 | A1 | | 2/2014 | Kang et al. |

FOREIGN PATENT DOCUMENTS

| | | | |
|---|---|---|---|
| JP | 11-195802 | A | 7/1997 |
| JP | H11-307789 | A | 11/1999 |
| JP | 2000164912 | A | 6/2000 |
| JP | 2001-68701 | A | 3/2001 |
| JP | 2001332751 | A | 11/2001 |
| JP | 2004-207464 | A | 7/2004 |
| JP | 2005-156840 | A | 6/2005 |
| JP | 2010-41040 | A | 2/2010 |
| JP | 2011-512663 | A | 4/2011 |
| JP | 2011-159746 | A | 8/2011 |
| JP | 2011-222558 | A | 11/2011 |
| JP | 2011-222968 | A | 11/2011 |
| JP | 2012-51113 | A | 3/2012 |
| KR | 10-2012-0121363 | A | 11/2012 |
| WO | 2011-142956 | A2 | 11/2011 |
| WO | WO 2012/010558 | * 1/2012 ............. C08G 18/12 |
| WO | 2012/066794 | A1 | 5/2012 |

OTHER PUBLICATIONS

First Office Action, dated Jul. 5, 2016, issued in corresponding Japanese Application No. 2012-268724, dated Dec. 7, 2012, 7 pages.

International Preliminary Report on Patentability and Written Opinion dated Jun. 9, 2015, issued in corresponding International Application No. PCT/JP2013/082864, filed Dec. 6, 2013, 10 pages.

International Search Report dated Jan. 14, 2014, issued in International Application No. PCT/JP2013/082864, filed Dec. 6, 2012, 5 pages.

Decision of Rejection dated Feb. 21, 2017, issued in Japanese Application No. 2012-268724, filed Dec. 7, 2012, 7 pages.

Office Action dated Aug. 29, 2017, issued in Japanese Application No. 2012-268724, filed Dec. 7, 2012, 6 pages.

* cited by examiner

SOLAR CELL INTEGRATED FILM MATERIAL

CROSS-REFERENCE TO RELATED APPLICATIONS

This application is a Continuation Application of PCT Application No. PCT/JP2013/082864, filed Dec. 6, 2013 and based upon and claiming the benefit of priority from prior Japanese Patent Application No. 2012-268724, filed Dec. 7, 2012, the entire contents of all of which are incorporated herein by reference.

TECHNICAL FIELD

The present invention relates to a solar cell integrated film material made by integrating a solar cell with a film material.

BACKGROUND ART

In recent years, solar cells are receiving attention as a clean energy source, and are mounted on, for example, house roof, window, steel plate, and ETFE film. In addition, solar cells may be sewn onto a tent base film or the like by thread, and the solar cells may be bonded to the tent base film by fastener. Also, the solar cells may be integrated with the tent base film, by rope edge or the like. Furthermore, fire-proof performance of solar cells is improved by using a frame-resistant sealing material for sealing the solar cells.

As a composite material having optical transparency, laminated film materials composed of woven or nonwoven fabric and a resin film are used in many fields such as the construction field. Woven fabric and nonwoven fabric are made of fibers such as glass fiber, and subjected to various filling treatment for keeping their shape. Thermoplastic resins are widely used in this treatment. Integration of the film material with a solar cell is desired, because the integration will further promote the use of the solar cell in a wide range of fields such as the construction field.

CITATION LIST

Patent Literatures

Patent Literature 1: Jpn. Pat. Appln. KOKAI Publication No. 2011-222558
Patent Literature 2: Jpn. Pat. Appln. KOKAI Publication No. 2004-207464

BRIEF SUMMARY OF THE INVENTION

Technical Problem

The problem to be solved by the present invention is to provide a solar cell integrated film material having good adhesion between the film material and the solar cell.

Solution to Problem

According to one embodiment, a solar cell integrated film material includes a film material, a solar cell, a glass fiber sheet and bonding layers. The film material includes a heat-resistant fabric and a fluorocarbon resin layer formed on both sides of the heat-resistant fabric. The glass fiber sheet is provided between the film material and the solar cell. The bonding layers are provided between the film material and the glass fiber sheet, and between the glass fiber sheet and the solar cell.

Advantageous Effects of Invention

According to the present invention, a solar cell integrated film material having good adhesion between the film material and the solar cell is provided.

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The embodiments of the present invention are described below in detail.

The solar cell integrated film material according to an embodiment includes a film material, a solar cell, a class fiber sheet, and bonding layers. The film material includes a heat-resistant fabric, and fluorocarbon resin layers formed, on both sides of the heat-resistant fabric. The glass fiber sheet is arranged between the film material and solar cell. The bonding layers are arranged between the film material and glass fiber sheet, and between the glass fiber sheet and solar cell.

A solar cell was integrated with a film material by various methods, such as a method of using an adhesive such as polyethylene or ethylene-vinyl acetate copolymer resin (EVA), or a method of placing adhesive layers sandwiching a polyethylene naphthalate resin (PEN) film between a solar cell and a film material, but any of them showed poor durability. The main reason for this is as follows: a solar cell repeats expansion and contraction by the change of the outside air temperature, and the repeated expansion and contraction for a long term can cause deformation or breakage of the solar cell and deterioration of the power generation, because there is a great difference in the linear expansion between the solar cell and film material.

The inventors have found that the life of a solar cell is improved by placing a glass fiber sheet between a solar cell and a film material, and integrating them with a bonding layer, thereby absorbing the stress produced by the difference in linear expansion in the glass fiber sheet, and preventing the solar cell from being detached from the film material. In addition, the use of a glass fiber sheet also improves the insulating properties between the solar cell and film material, fire prevention properties, flexibility, weight reduction, and appearance of the solar cell integrated film material.

Figure 1:
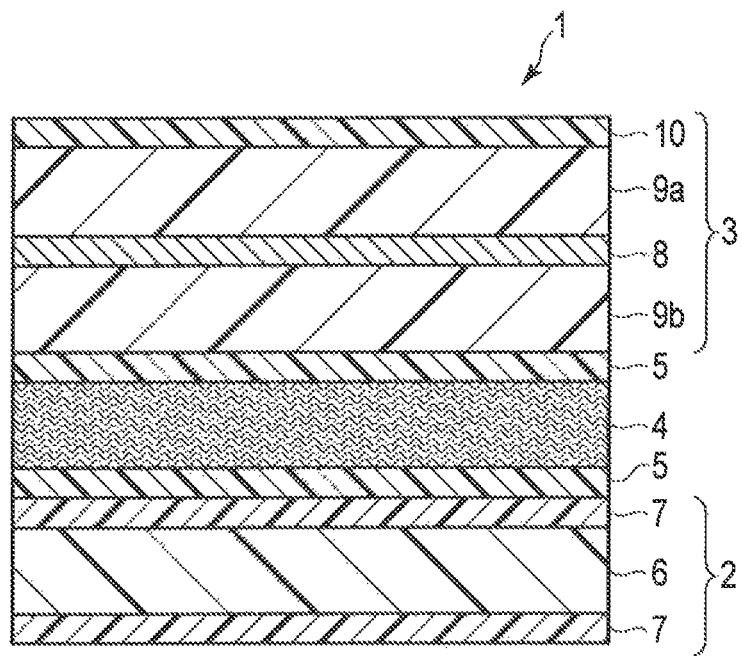
FIG. 1 is a cross sectional view showing the solar cell integrated film material according to an embodiment.

An example of the solar cell integrated film material is described with reference to FIG. 1. A solar cell integrated film material 1 includes a film material 2, a solar cell 3, a glass fiber sheet 4, and bonding layers 5. The film material 2 includes a heat-resistant fabric 6, and fluorocarbon resin layers 7 formed on both sides of the heat-resistant fabric 6.

The solar cell 3 includes a solar cell component 8, first and second sealing material layers 9a and 9b formed on both sides of the solar cell component 8, and an ethylene-tetrafluoroethylene copolymer layer (weather resistant layer) 10 formed on the first sealing material layer 9a. The glass fiber sheet 4 is arranged between the second sealing material layer 9b of the solar cell 3 and the fluorocarbon resin layer 7 of the film material 2. The bonding layers 5 are arranged between the second sealing material layer 9b of the solar cell 3 and the glass fiber sheet 4, and between the fluorocarbon resin layer 7 of the film material 2 and the glass fiber sheet 4. Sunlight enters from the surface of the ethylene-tetrafluoroethylene copolymer layer 10, is absorbed into the solar cell component 8 through the first sealing material layer 9a, and causes power generation reaction in the solar cell component 8.

The film material 2, solar cell 3, glass fiber sheet and bonding layer 5 are described below.

(1) Film Material 2

The heat-resistant fabric 6 is formed of, for example, a material containing at least one selected from the group consisting of glass fiber, aramid fiber, and iron alloy fiber. The fiber may be used alone or in combination of two or more of them. The material preferably contains glass fiber. The woven fabric is formed of, for example, threads composed of single fiber bundles (multifilaments).

The filament diameter of the single fiber is from 3.30 μm to 4.05 μm. In addition, the thread composed of single fiber bundles (multifilaments) is from 10 tex to 400 tex. These components further improve the flexibility and strength of the woven fabric.

The weave of the woven fabric may be plain weave, basket weave, twill weave, modified twill weave, or long shaft weave.

The fluorocarbon resin layer formed on both sides of the heat-resistant fabric preferably contains at least one selected from the group consisting of polytetrafluoroethylene, perfluoroalkoxyalkane, perfluoroethylene propene copolymer, ethylene-tetrafluoroethylene copolymer, and polyvinylidene fluoride. The resin may be used alone or in combination of two or more of them.

The film material 2 preferably has a tear break strength of 100 to 600 N in the warp direction, 90 to 700 N in the weft direction, a tensile break strength of 2000 to 7000 N/3 cm in the warp direction, 1500 to 6300 N/3 cm in the weft direction, and a break elongation of 3.0 to 10.0% in the warp direction, and 4.0 to 15.0% in the weft direction.

(2) Solar Cell 3

The solar cell component 8 is, for example, an amorphous silicon (a-Si) solar cell, or an amorphous silicon germanium (a-SiGe) solar cell. A transparent electrode is arranged on one outermost layer of the solar cell component 8, and a metal electrode is arranged on the other outermost layer. The first sealing material layer 9a is arranged on the transparent electrode, and the second sealing material layer 9b is arranged on the metal electrode.

The first and second sealing material layers 9a and 9b are preferably formed of an optically transparent material, and more preferably a transparent or translucent material. The optically transparent material may be at least one selected from the group consisting of polyethylene resin, ethylene-vinyl acetate copolymer resin, ethylene tetrafluoride-ethylene copolymer resin, butyral resin, silicon resin, epoxy resin, and fluorinated polyimide resin. The resin may be used alone or in combination of two or more of them.

(3) Glass Fiber Sheet 4

Examples of the glass fiber sheet 4 include glass fiber nonwoven fabric and glass fiber woven fabric.

The glass fiber nonwoven fabric preferably has a thickness of 0.15 mm to 0.85 mm, a basis weight of 15 $g/m^2$ to 110 $g/m^2$ (more preferably 25 $g/m^2$ to 51 $g/m^2$), and a bulk density of 0.1 $g/cm^3$ to 0.5 $g/cm^3$. This nonwoven fabric has good adhesion properties for the bonding layer 5, marked insulating properties, fire-proof properties, and flexibility, allows weight reduction, and improves the appearance of the solar cell integrated film material 1, (4) Bonding Layer 5

The bonding layer 5 preferably contains an adhesive resin. Examples of the adhesive resin include at least one selected from the group consisting of polyethylene, grafted polyethylene, ethylene vinyl acetate copolymer resin, polytetrafluoroethylene, perfluoro alkoxyalkane, perfluoroethylene propene copolymer, ethylene-tetrafluoroethylene copolymer, and polyvinylidene fluoride. The resin may be used alone or in combination of two or more of them.

The thickness of the bonding layer 5 is preferably from 0.15 mm to 0.85 mm (more preferably from 0.15 mm to 0.4 mm).

In order to increase the adhesion between the bonding layer 5 and the second sealing material layer 9b of the solar cell 3, and the adhesion between the bonding layer 5 and the fluorocarbon resin layer 7 of the film material 2, anchoring treatment is carried out. Anchoring treatment may be carried out by subjecting the surface of the second sealing material layer 9b and/or the fluorocarbon resin layer 7, or incorporating silicon dioxide particles into the bonding layer 5 and/or the fluorocarbon resin layer 7. Either or both of the etching treatment and addition of silicon dioxide particles may be carried out. When the bonding layer 5 and second sealing material layer 9b are formed of the same material (for example, polyethylene), anchoring treatment is not absolute necessary.

Examples of the etching treatment include vacuum plasma discharge treatment, atmospheric pressure plasma discharge treatment, corona discharge treatment, and sodium etching treatment.

The silicon dioxide particles may be present, at the interface between the bonding layer 5 and fluorocarbon resin layer 7, and/or the interface between the bonding layer 5 and second sealing material layer 9b. Both of these cases can increase the anchor effect of the silicon dioxide particles.

The silicon dioxide ($SiO_2$) is preferably amorphous silica. The amorphous silica is more preferably hydrophilic amorphous silica.

The silicon dioxide particles preferably have a specific surface area of 10 $m^2/g$ or more as measured by the adsorption isotherm using Brunauer-Emmett-Teller (BET) model. When the specific surface area is 10 $m^2/g$ or more, the adhesion between the solar cell and film material is improved. The more preferred range is from 50 $m^2/g$ to 400 $m^2/g$.

The average primary particle size of the silicon dioxide particles is preferably from 5 nm to 80 nm, more preferably from 7 nm to 40 nm. The average primary particle size of the silicon dioxide particles can be measured by a transmission electron microscope.

The solar cell integrated film material is lightweight, so that its mounting on buildings is likely easy. For example, the material in a panel form is mounted on a wall surface or roof surface by bolting, or the tension is applied to the material by the wire fixed at the edge of the material and the material is mounted under the tension.

The solar cell integrated film material is made by, for example, following method.

A heat-resistant fabric is soaked in an aqueous suspension of a fluorocarbon resin, thereby applying the fluorocarbon resin aqueous suspension to the heat-resistant fabric. The fabric is dried at 100° C. to 200° C., and sintered at an ambient temperature of 330° C. to 400° C. The series of the processes composed of application, drying, and sintering is repeated several times to form a fluorocarbon resin layer on the both sides of the heat-resistant fabric, and thus obtaining a film material. Silicon dioxide particles are present in the surface layer of the fluorocarbon resin layer of the film material, through the addition of silicon dioxide particles to the aqueous suspension of the fluorocarbon resin, application of the suspension thus obtained to the heat-resistant fabric, and drying and sintering the fabric.

The film material, bonding layer, glass fiber sheet, bonding layer, and solar cell are laminated in this order, and the laminate thus obtained is pressurized under heating, and then pressurized under cooling, thereby obtaining a solar cell integrated film material.

Before lamination, the surface opposed to the bonding layer of the film material and/or the surface opposed to the bonding layer of the solar cell may be subjected to etching treatment. As a result of this, the adhesion between the solar cell and film material is further improved.

EXAMPLES

Examples are described below.

Example 1

A plain weave glass fiber woven fabric as a heat-resistant fabric was soaked in an ethylene tetrafluoride resin (PTFE) aqueous suspension (concentration: 60% by weight, model: D210C, manufactured by Daikin Industries), thereby applying the PTFE aqueous suspension to the glass fiber woven fabric. Subsequently, the fabric was dried at 100° C., and then sintered at 400° C. A series of the processes composed of application, drying, and sintering was repeated several times. The glass fiber woven fabric was soaked in a suspension composed of 100 parts by weight of a PTFE aqueous suspension and 12 parts by weight of hydrophilic amorphous silica particles (manufactured by Nippon Aerosil Co., Ltd., specific surface area: 50 $m^2/g$ as measured by the adsorption isotherm using Brunauer-Emmett-Teller (BET) model, average primary particle size: 30 nm) to apply the suspension to the fabric, the fabric was dried at 100° C., and then sintered at 400° C., thereby forming PTFE layers containing hydrophilic amorphous silica particles on the both sides of the glass fiber woven fabric, and thus obtaining a film material.

Subsequently, the film material was arranged on the lower plate surface of a vacuum heating and cooling press, and polyethylene film (thickness: 150 μm) as a bonding layer, a glass fiber nonwoven fabric (thickness: 0.39 mm, basis weight: 49.5 $g/m^2$, bulk density: 0.13 $g/cm^3$), and polyethylene film (thickness: 150 μm) as a bonding layer were stacked in this order on the top surface of the PTFE layer of the film material.

A solar cell including an ethylene-tetrafluoroethylene copolymer layer as a weather resistant layer, and polyethylene layers having a thickness of 400 μm as the first and second sealing material layers was provided, and the surface opposed to the bonding layer of the second sealing material layer was subjected to plasma discharge treatment. The solar cell was stacked on the film material, and the surface of the solar cell treated with plasma discharge was stacked on the bonding layer of the film material.

Subsequently, the lower plate of the vacuum heating and cooling press was heated at 150° C. under vacuum to subject the laminate to a pressurization heating process (pressing force: 0.1 MPa, press time: 20 minutes), and then the lower plate of the vacuum heating and cooling press was cooled to 120° C. under vacuum to subject the laminate to a pressurization cooling process (pressing force: 0.1 MPa, press time: 20 minutes), and thus obtaining a solar cell integrated film material.

Comparative Example 1

Figure 2:
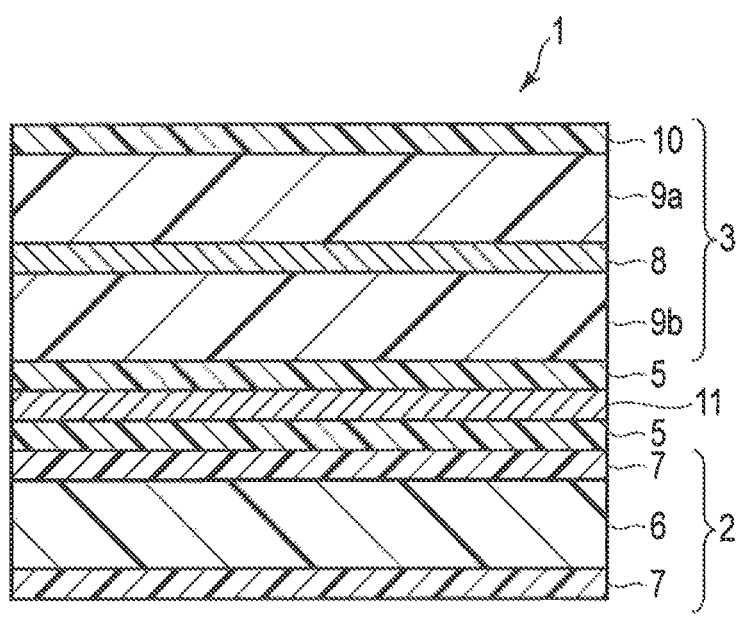
FIG. 2 is a cross sectional view showing the solar cell integrated film material of Comparative Example 1.

A solar cell integrated film material shown in FIG. 2 was obtained in the same manner as in Example 1, except that SUS foil 11 having a thickness of 100 μm was used in place of the glass fiber nonwoven fabric, and bonding layers 5 (polyethylene film having a thickness of 150 μm) were formed on both sides of the SUS foil 11.

Comparative Example 2

A solar cell integrated film material was obtained in the same manner as in Example 1, except that PEN polyethylene naphthalate resin) having a thickness of 50 μm was used in place of the glass fiber nonwoven fabric, and bonding layers 5 (polyethylene film having a thickness of 150 μm) were formed on both sides of the PEN film.

Comparative Example 3

A solar cell integrated film material was obtained in the same manner as in Example 1, except that a polyethylene film having a thickness of 300 μm was used in place of the glass fiber nonwoven fabric and a bonding layer.

The solar cell integrated film materials of Example 1 and Comparative Examples 1 to 3 were subjected to temperature cycle test. More specifically, the film material was subjected to a regular temperature cycle of −40° C. to 80° C.; the reduction from the initial output was 0% at the time of 300 cycles for Example 1, 1% at the time of 200 cycles for Comparative Example 1, 2% at the time of 200 cycles for Comparative Example 2, and 40% the time of 200 cycles for Comparative Example 3. Table 1 shows the result of evaluation of the temperature cycle characteristics rated on a four-point scale (A: very good characteristics, B: no problem with characteristics, C: characteristics may be improved by any countermeasure, D: characteristics have a problem).

In addition, the solar cell integrated film materials of Example 1 and Comparative Examples 1 to 3 were evaluated for insulating properties, fire prevention properties, flexibility, weight, and appearance, and the results were rated on a four scale: A=properties are markedly good, B=properties have no problem, C=properties may be improved by countermeasures, D=properties have problems. The results are shown in Table 1.

TABLE 1

| | Material name | Temperature cycle test (time) | Temperature cycle characteristics | Insulation properties | Fire prevention properties | Flexibility | Weight | Appearance |
|---|---|---|---|---|---|---|---|---|
| Example 1 | Glass fiber nonwoven fabric | 300 | A | B | B | B | B | B |
| Comparative Example 1 | SUS foil (thickness: 100 μm) | 200 | B | C | A | D | D | D |
| Comparative Example 2 | PEN film (thickness: 50 μm) | 200 | B | B | D | B | B | B |
| Comparative Example 3 | PE film alone (thickness: 300 μm) | 200 | D | B | D | B | A | A |

As is evident from Table 1, Example 1 using a glass fiber nonwoven fabric was superior to Comparative Example 1 using SUS foil and Comparative Example 2 using a PEN film in the temperature cycle characteristics, and there was no problem with the insulating properties, fire prevention properties, flexibility, weight, and appearance. Comparative Example 1 had problems with temperature cycle characteristics, flexibility, weight, and appearance. On the other hand, Comparative Example 2 had problems with the temperature cycle characteristics and fire prevention properties.

Examples 2 to 6

A solar cell integrated film material was obtained in the same manner as in Example 1, except that the thickness of the bonding layer, the bulk density, thickness, and basis weight of the glass fiber nonwoven fabric, and the thickness of the first and second sealing material layers of the solar cell were set as shown in the following Table 2.

The solar cell integrated film materials of Examples 1 to 6 were subjected to fire leap test. A sintered wood crib was placed on the likely weakest part of the specimen, wind was applied from the fan at a rate of 1.0 m/s, and whether the specimen can be used as a building material or not was determined based on the burn-through of the sintered object to the backside, presence or absence of fire on the backside, and the range of sintered area on the surface. The distance between the fan and the specimen was set at 1050 mm. The results of the fire leap test are shown in Table 2. Those showed no burn-through to the backside, no fire on the backside, and having a hole size of 10 mm$^2$ or less were judged acceptable; Examples 1, 3, 5, and 6 passed the fire leap test. Examples 2 and 4 failed the fire leap test, because Example 2 showed burn-through to the backside, and Example 4 showed a large loss area in the cell, and the hole size was greater than 10 mm$^2$.

TABLE 2

| Sample constitution | Example 1 | Example 2 | Example 3 | Example 4 | Example 5 | Example 6 |
|---|---|---|---|---|---|---|
| Distance mm to fan | 1050 | 1050 | 1050 | 1050 | 1050 | 1050 |
| Total thickness (μm) of solar cell sealing material layer | 800 | 800 | 800 | 800 | 300 | 300 |
| Total thickness (μm) of bonding layers | 300 | 300 | 300 | 300 | 300 | 300 |
| Glass fiber nonwoven fabric (bulk density: g/cm$^3$) | 0.13 | 0.13 | 0.12 | 0.13 | 0.13 | 0.13 |
| Glass fiber nonwoven fabric (thickness: mm) | 0.39 | 0.32 | 0.42 | 0.71 | 0.2 | 0.32 |
| Glass fiber nonwoven fabric basis weight (g/cm$^2$) | 49.5 | 41.1 | 50.8 | 90.4 | 25.5 | 41.1 |
| Front surface | | | | | | |
| Range of fire spread on the cell | Large | Large | Large | Large | Middle | Middle |
| Cell loss area | Middle | Small | Middle | Large | Middle | Middle |
| PE burning state | Largely melted | Largely melted | Largely melted | Moderately melted | Slightly melted | Slightly melted |
| Back surface | | | | | | |
| Melt drop (PE) | None | None | None | None | None | None |
| Melt drop (fluorocarbon resin) | 2 minutes: fluorocarbon resin burned; 2 minutes 30 seconds: fluorocarbon resin dropped | 1 minute 40 seconds: fluorocarbon resin dropped | 2 minutes: fluorocarbon resin burned; 2 minutes 20 seconds: fluorocarbon resin dropped | 2 minutes 5 seconds: fluorocarbon resin dropped | 1 minute 20 seconds: fluorocarbon resin dropped | 1 minute: fluorocarbon resin melted; 1 minute: fluorocarbon resin dropped |
| Backside firing | None | Fired 1 minute 40 seconds | None | None | None | None |
| Amount of melt drops | Moderate drop (medium) | Small drop (small) | Small drop (small) | Small drop (small) | Small drop (medium) | Small drop (medium) | of the first and second sealing material layers of the solar cell were set as shown in the following Table 2.

the same manner as in Example 1, except that the bulk density, basis weight, and thickness of the glass fiber nonwoven fabric were set as shown in the following Table 3, and the thickness of the bonding layer was 150 μm (the total thickness of the bonding layers was 300 μm).

The solar cell integrated film materials of Examples 5 to 10 were subjected to the temperature cycle test under the similar conditions as described above, and the output reduction from the initial output at the time of 200 cycles was confirmed. Table 3 shows the result; when the output reduction from the initial output was less than 10%, the sample was rated good, and when the output reduction was greater than 10%, the sample was rated defective.

In addition, Examples 7 to 10 were subjected to the fire leap test under the similar conditions as described above, and the results are shown in Table 3.

Furthermore, the appearance of the solar cell integrated film materials of Examples 5 to 10 was observed, and visibility of the presence of the glass fiber nonwoven fabric between the solar cell and film material was judged. When the presence is invisible, the sample was rated good, and when the presence of the glass fiber nonwoven fabric is visible, the sample was rated poor. The results are shown in Table 3.

nonwoven fabric until the percentage of elongation in both horizontal and vertical directions became 1.4% was repeated 4000 times. The voltage of Example 6 decreased about 3% from the initial measured value at the time of completion of 4000 times of the test, but the voltage decrease was smaller in comparison with comparative Examples 1 to 3 using no glass fiber nonwoven fabric.

(Temperature Cycle Test)

As shown in the above-described Table 3, the output reduction of Example 6 from the initial output was less than 10% at the time of 200 cycles. In addition, although the adhesive strength between the glass fiber nonwoven fabric and bonding layer depends on the degree of penetration of polyethylene into the glass fiber nonwoven fabric, no peeling was observed even after 200 cycles, (High Temperature and High Humidity Test)

The solar cell integrated film material of Example 6 was stored for 1000 hours at a temperature of 85° C. and a relative humidity of 85%, and then subjected to 180° peel strength test. (JIS K 6854-2, test length: 50 mm, test speed: 100 mm/min); the peel strength after 1000 hours did not decrease from the initial value.

TABLE 3

Table 3

|  | Example 5 | Example 6 | Example 7 | Example 8 | Example 9 | Example 10 |
|---|---|---|---|---|---|---|
| Bulk density (g/cm³) | 0.13 | 0.13 | 0.125 | 0.13 | 0.13 | 0.12 |
| Basis weight (g/cm²) | 25.5 | 41.1 | 25 | 90.4 | 177 | 50.8 |
| Thickness (mm) | 0.2 | 0.32 | 0.2 | 0.71 | 1.32 | 0.42 |
| Temperature cycle | Good | Good | Good | Good* | Good* | Good |
| Fire leap test | Pass | Pass | Pass | Pass | Pass | Pass |
| Appearance | Good | Good | Good | Poor | Poor | Good |

As is evident from Table 3, Examples 5 to 10 showed good temperature cycle characteristics, and passed the fire leap test. In Examples 8 and 9, presence of the glass fiber nonwoven fabric was confirmed by visual observation, and the thickness of the glass fiber nonwoven fabric was markedly greater than the total thickness of the bonding layer (300 μm), so that spaces tend to remain inside of the glass fiber nonwoven fabric, and the temperature cycle characteristics can deteriorate because of expansion of the glass fiber nonwoven fabric. In the temperature cycle test, the amount of power generation is maintained even after completion of 200 cycles by using a glass fiber nonwoven fabric having a thickness of, for example, 0.32 mm to 0.42 mm equivalent to the total thickness (300 μm) of the bonding layer. The bulk density of the glass fiber nonwoven fabrics used in Examples 5 to 10 are almost the same, so that the influence of the thickness of the glass fiber nonwoven fabric is significant in the fire leap test. According to the comprehensive judgment in consideration of the appearance after lamination, when the total thickness of the bonding layer is 300 μm, the thickness of the glass fiber nonwoven fabric is preferably from 0.3 to 0.5 mm.

The solar cell integrated film material of Example 6 was subjected to repeated test, temperature cycle test, high temperature and high humidity test, and accelerated exposure test; the results are shown below.

(Repeated Test)

A load of 6 kgf/cm was applied to a solar cell integrated film material, and the operation of extending the glass fiber (Accelerated Exposure Test)

The solar cell integrated film material of Example 6 was irradiated with ultraviolet ray using a weather meter for a period equivalent to four years; the appearance had no problem.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solar cell integrated film material comprising:
   a film material comprising a heat-resistant fabric and a fluorocarbon resin layer formed on both sides of the heat-resistant fabric;
   a solar cell comprising a weather resistant layer;
   a glass fiber sheet provided between the film material and the solar cell;
   a first bonding layer provided between the film material and the glass fiber sheet; and
   a second bonding layer provided between the glass fiber sheet and the solar cell,
   wherein the weather resistant layer is an outermost layer of the solar cell, a surface of the other outermost layer of the solar cell directly adheres to the second bonding layer and the second bonding layer directly adheres to the glass fiber sheet, and the first bonding layer consists of a first adhesive resin or a mixture of a first adhesive resin and silicon dioxide particles, and the second bonding layer consists of a second adhesive resin, wherein the first and second adhesive resins are the same.

2. The solar cell integrated film material of claim 1, wherein the fluorocarbon resin layer comprises silicon dioxide particles.

3. The solar cell integrated film material of claim 2, wherein the silicon dioxide particles are hydrophilic amorphous silica particles.

4. The solar cell integrated film material of claim 1, wherein silicon dioxide particles are present at an interface between the first bonding layer and the fluorocarbon resin layer.

5. The solar cell integrated film material of claim 4, wherein the silicon dioxide particles are hydrophilic amorphous silica particles.

6. The solar cell integrated film material of claim 1, wherein the adhesive resin is selected from the group consisting of polyethylene, grafted polyethylene, ethylene-vinyl acetate copolymer resin, polytetrafluoroethylene, perfluoro alkoxyalkane, perfluoroethylene propene copolymer, ethylene-tetrafluoroethylene copolymer, and polyvinylidene fluoride.

7. The solar cell integrated film material of claim 1, wherein the glass fiber sheet is a glass fiber nonwoven fabric.

8. The solar cell integrated film material of claim 7, wherein the glass fiber nonwoven fabric has a thickness of 0.15 mm to 0.85 mm, a basis weight of 15 $g/m^2$ to 110 $g/m^2$, and a bulk density of 0.1 $g/cm^3$ to 0.5 $g/cm^3$.

9. The solar cell integrated film material of claim 1, wherein the heat-resistant fabric comprises at least one selected from the group consisting of glass fiber, aramid fiber, and iron alloy fiber.

10. The solar cell integrated film material of claim 1, wherein a weave of the heat-resistant fabric is basket weave, twill weave, modified twill weave, long shaft weave, or plain weave.

11. The solar cell integrated film material of claim 1, wherein the fluorocarbon resin layer comprises at least one selected from the group consisting of polytetrafluoroethylene, perfluoroalkoxyalkane, perfluoroethylene propene copolymer, ethylene-tetrafluoroethylene copolymer, and polyvinylidene fluoride.

12. The solar cell integrated film material of claim 1, wherein the solar cell comprises a solar cell component, first and second sealing material layers formed on both sides of the solar cell component, and the weather resistant layer consisting of ethylene-tetrafluoroethylene copolymer formed on the first or second sealing material layer.

13. The solar cell integrated film material of claim 12, wherein the first and second sealing material layers comprise at least one selected from the group consisting of polyethylene resin, ethylene-vinyl acetate copolymer resin, butyral resin, silicon resin, epoxy resin, and fluorinated polyimide resin.

14. The solar cell integrated film material of claim 12, wherein the second sealing material layer is the other outermost layer of the solar cell, and the second sealing material layer and the second bonding layer comprise the same material.

15. The solar cell integrated film material of claim 1, wherein the first bonding layer and the second bonding layer each consist of polyethylene as the adhesive resin.

16. The solar cell integrated film material of claim 1, wherein the first adhesive resin and the second adhesive resin are both polyethylene.

* * * * *